United States Patent [19]

Kawakita et al.

[11] Patent Number: 5,783,855

[45] Date of Patent: Jul. 21, 1998

[54] LATERAL TRANSISTOR

[75] Inventors: Keisuke Kawakita; Takahiro Yashita, both of Tokyo, Japan

[73] Assignees: Mitsubishi Denki Kabushiki Kaisha; Mitsubishi Electric Engineering Co., Ltd., both of Tokyo, Japan

[21] Appl. No.: 577,373

[22] Filed: Dec. 22, 1995

[30] Foreign Application Priority Data

Aug. 18, 1995 [JP] Japan ................................. 7-210609

[51] Int. Cl.⁶ ........................................................ H01L 29/00
[52] U.S. Cl. ........................... 257/560; 257/565; 257/557
[58] Field of Search ................................... 257/557, 560, 257/561, 578, 565, 563

[56] References Cited

U.S. PATENT DOCUMENTS 3,465,214  9/1969  Donald ................................. 257/578
5,200,803  4/1993  Leduc .................................. 257/560

FOREIGN PATENT DOCUMENTS 0322962  7/1989  European Pat. Off. ............. 257/557

*Primary Examiner*—Jerome Jackson
*Assistant Examiner*—Nathan K. Kelley
*Attorney, Agent, or Firm*—Leydig, Voit & Mayer, Ltd.

[57] ABSTRACT

A lateral transistor includes a first conductivity type semiconductor substrate, a first second conductivity type region in the substrate, a second second conductivity type region in the substrate spaced from and partially surrounding the first region including a plurality of sides and corners; an electrically insulating film covering the semiconductor substrate and including respective penetrating holes extending to the first and second regions; a first metal film disposed on the insulating film and contacting the second region through a first of the penetrating holes; and a second metal film disposed on the insulating film and contacting the first region through a second of the penetrating holes wherein the first metal film is missing opposite a first of the corners of the second region and the second metal film extends across the second region at the first corner.

22 Claims, 10 Drawing Sheets

LATERAL TRANSISTOR

BACKGROUND OF THE INVENTION

1. Field of the Invention

The invention relates to a lateral type transistor. More specifically it relates to a lateral type transistor from which a metal layer and/or a semi-conductor layer at one of the corner portions of an emitter-surrounding collector layer are/is removed, and a metal layer is formed for drawing a current from the emitter along the corner portion.

2. Description of the Prior Art

FIGS. 7A, 7B show a configuration of a conventional single-element lateral type transistor. The configuration of FIGS. 7A, 7B comprises an n-type semiconductor layer 1, a collector layer 2, namely a p-type semiconductor layer provided in the n-type semiconductor layer 1, an emitter 3, namely a p-type semiconductor layer provided in the n-type semiconductor layer 1, an insulating layer 4 which covers the surface of n-type semiconductor substrate 1, a collector electrode 5 provided on the outer surface of insulating layer 4 through a penetration hole opened in insulating layer 4, an insulating layer 6 which covers the surface of insulating layer 4 and collector electrode 5, and an emitter electrode 7 drawn out from emitter layer 3.

In this conventional lateral type transistor configuration, a base layer composed of n-type semiconductor is laid between the periphery of emitter layer 3 and square doughnut-shaped collector layer 2 which surrounds the emitter layer 3. A transistor is composed of collector layer 2, n-type semiconductor layer 1 and emitter layer 3. Such lateral type transistor requires an electrode taking out of central emitter layer 3. In the conventional art, the middle metal portion of the square collector electrode 5 is removed and an emitter electrode 7 is formed along the removed portion.

On the other hand, FIGS. 8A, B show a configuration of another conventional single-element lateral type transistor. In FIGS. 8A, B, the explanation is omitted because the same numerals as in FIGS. 7A, B denote the same elements or components. In the configuration of a conventional lateral type transistor shown in FIGS. 8A, B, a base layer composed of n-type semiconductor is laid between the periphery of emitter layer 3 and square doughnut-shaped collector layer 2 which surrounds the emitter layer 3. Further, in such lateral type transistor, metal layer 7 is formed through a penetration hole opened in both insulating layer 4 and the overlying insulating layer 6 without removing metal portion 5 in any sides of square collector electrode 5. And this metal layer 7 is formed along insulating layer 6 as an emitter electrode.

FIGS. 9A, B show a configuration of another lateral type transistor, wherein a plurality of elements in the prior art constitute an unit transistor, and such unit transistors are connected in parallel. A configuration of a conventional lateral type transistor shown in FIGS. 9A, B is composed of a plurality of lattice-shaped transistor cells. In each transistor cell, a base layer composed of n-type semiconductor is laid between the periphery of emitter layer 3 and square doughnut-shaped collector layer 2 surrounding the emitter layer 3. These collector layer 2, n-type base layer 1 and emitter layer 3 constitute a transistor. Connecting a plurality of unit transistors in parallel, it becomes possible for such lateral type transistors to constitute a transistor having a large capacity.

In order to connect a plurality of unit transistors, metal layer 7 is formed through penetration holes opened in both insulating layer 4 and the overlying insulating layer 6 without removing metal portions in each sides of square collector electrode 5, as FIGS. 9A, B show. The emitter layers in each transistor cell are connected via this metal layer 7.

FIGS. 10A, B shows a configuration of a lateral type transistor, wherein a unit transistor is composed of a plurality of elements in the prior art, and such unit transistors are connected in parallel. In FIGS. 10A, B, it is possible to open penetration hole simply in both insulating layer 4 and insulating layer 6 which are overlying emitter layer 3, and to connect mutually emitter layers 3 in a plurality of transistor cells by multi layer interconnection through this penetration hole.

However, in the conventional lateral type transistor shown in FIGS. 7A, B, a metal portion in the one side of collector electrode 5 is removed to draw out emitter electrode 7 along that portion. If that portion of collector electrode 5 is removed, an operation area for a transistor is narrowed because a transistor is mainly laid in the periphery of central emitter layer 3 and the surrounding collector layer 2 in lateral type transistor. Accordingly, such configuration makes it impossible for power transistor requiring a large power to secure enough capacity.

Further, the conventional lateral type transistor shown in FIGS. 8A, B provides insulating layer 6 over collector electrode 5 without removing a metal portion in the one side of collector electrode 5. Emitter electrode 7 is drawn out along top surface of insulating layer 6 through a penetration hole opened in insulating layer 4 and overlying insulating layer 6. Although a current capacity per one transistor cell is enlarged, since collector electrode 5 can be drawn out from every four sides of collector layer 2 in the transistor cell, further processes are required for opening penetration holes at insulating layer 6. Moreover, the dimensions of emitter should be enlarged. Accordingly, such transistor is less advantageous in the downsizing.

Further, the conventional lateral type transistor shown in FIGS. 9A, B provides insulating layer 6 over collector electrode 5 without removing a metal portion in the one side of collector electrode 5. Emitter electrode 7 is drawn out along the top surface of insulating layer 6 through a penetration hole opened in insulating layer 4 and overlying insulating layer 6 and connects mutually each emitter in each transistor cell. Also in this configuration, a current capacity per one transistor cell is enlarged, because collector electrode 5 can be drawn out from every four sides of collector layer 2 in the transistor cell. However the opening of insulating layer 4 and the overlying insulating layer 6 should be enlarged because it becomes difficult to contact a diffusion layer with aluminum when electrodes are drawn out from the diffusion layer. For this reason, the dimension of the emitters should be also enlarged. Accordingly, such transistor is less advantageous in the downsizing.

Further, also in the configuration of FIGS. 10A, B, each transistor cell becomes inevitably large because the dimension of emitter is enlarged. Accordingly, such transistor is less advantageous in chip-shrinking.

It is an object of the present invention to provide a high power lateral type transistor.

It is further object of the present invention to provide a small sized lateral type transistor by forming emitter electrode directly on insulating layer.

It is still further object of the present invention to provide a lateral type transistor in which no parasitic metal oxide semi-conductor transistor is formed by removing collector layer and/or collector electrode at one corner portion of the collector.

SUMMARY OF THE INVENTION

According to one aspect of the present invention, a lateral type transistor comprising a second semi-conductor layer formed in a first semi-conductor layer, a third semi-conductor layer separated from the second semi-conductor layer and formed around the second semi-conductor layer, a first insulating layer which covers surface of the first semi-conductor layer, and a first metal layer which is electrically connected with the third semi-conductor layer through a penetration hole opened in the first insulating layer: wherein, one corner portion of the first metal layer is removed; and a second metal layer is formed on the surface of the first insulating layer through a penetration hole opened in the insulating layer and drawn out diagonally from the second semi-conductor layer along the corner portion.

According to another aspect of the present invention, a lateral type transistor comprising a second semi-conductor layer formed in a first semi-conductor layer, a third semi-conductor layer separated from the second semi-conductor layer and formed around the second semi-conductor layer, a first insulating layer which covers surface of the first semi-conductor layer, and a first metal layer which is electrically connected with the third semi-conductor layer through a penetration hole opened in the first insulating layer: wherein, corner portions of the third semi-conductor layer and the first metal layer are removed; and a second metal layer are formed on surface of the first insulating layer through a penetration hole opened in the insulating layer and drawn out diagonally from the second semi-conductor layer along the corner portion.

According to another aspect of the present invention, a lateral type transistor comprised of unit transistor including a pair of two transistor cells, comprising a second semi-conductor layer formed in a first semi-conductor layer, a third semiconductor layer separated from the second semi-conductor layer and formed around the second semi-conductor layer, a first insulating layer which covers surface of the first semi-conductor layer, and a first metal layer which is electrically connected with the third semi-conductor layer through a penetration hole opened in the first insulating layer: wherein, one corner portion of the first metal layer where the two transistor cells cross is removed; a second metal layer is formed on surface of the first insulating layer through a penetration hole opened in the insulating layer and drawn out diagonally to connect the respective second semi-conductor layers of unit transistor along the corner portion; and the second metal layer is further connected with a metal layer through a penetration hole opened in a second insulating layer overlying on the first insulating layer, a plurality of unit transistors are connected via the metal layer in parallel.

According to another aspect of the present invention, a lateral type transistor comprised of unit transistor including a pair of two transistor cells, comprising a second semi-conductor layer formed in a first semi-conductor layer, a third semiconductor layer separated from the second semi-conductor layer and formed around the second semi-conductor layer, a first insulating layer which covers surface of the first semi-conductor layer, and a first metal layer which is electrically connected with the third semi-conductor layer through a penetration hole opened in the first insulating layer: wherein, corner portions of the first semiconductor layer and the first metal layer where the two transistor cells cross are removed; a second metal layer is formed on surface of the first insulating layer through a penetration hole opened in the insulating layer and drawn out diagonally to connect the respective second semi-conductor layers of unit transistor along the corner portion; and a metal layer connected to the second metal layer which is drawn out through a penetration hole opened in a second insulating layer 6, is connected with other outside unit transistors in parallel.

According to another aspect of the present invention, a lateral type transistor comprises of a unit transistor each including two pairs of two transistor cells, comprising a second semi-conductor layer formed in a first semi-conductor layer, a third semi-conductor layer separated from the second semi-conductor layer and formed around the second semi-conductor layer, a first insulating layer which covers surface of the first semi-conductor layer, and a first metal layer which is electrically connected with the third semi-conductor layer through a penetration hole opened in the first insulating layer: wherein, one corner portion of the first metal layer where the four transistor cells cross is removed; two second metal layer are formed on surface of the first insulating layer through a penetration hole opened in the insulating layer, and each second metal layer is drawn out diagonally to connect the respective second semiconductor layers of a pair of transistors along the corner portion; and the second metal layer is further connected with a metal layer through a penetration hole opened in a second insulating layer overlying on the first insulating layer, a plurality of unit transistors are connected via the metal layer in parallel.

According to another aspect of the present invention, a lateral type transistor comprises of a unit transistor each including two pairs of two transistor cells, comprising a second semi-conductor layer formed in a first semi-conductor layer, a third semi-conductor layer separated from the second semi-conductor layer and formed around the second semi-conductor layer, a first insulating layer which covers surface of the first semi-conductor layer, and a first metal layer which is electrically connected with the third semi-conductor layer through a penetration hole opened in the first insulating layer: wherein, corner portions of the third semi-conductor layer and the first metal layer where the four transistor cells cross are removed; two second metal layer are formed on surface of the first insulating layer through a penetration hole opened in the insulating layer, and each second metal layer is drawn out diagonally to connect the respective second semi-conductor layers of a pair of transistors along the corner portion; and the second metal layer is further connected with a metal layer through a penetration hole opened in a second insulating layer overlying on the first insulating layer, a plurality of unit transistors are connected via the metal layer in parallel.

DETAILED DESCRIPTION OF THE PREFERRED EMBODIMENTS

Embodiment 1

Figure 1A:
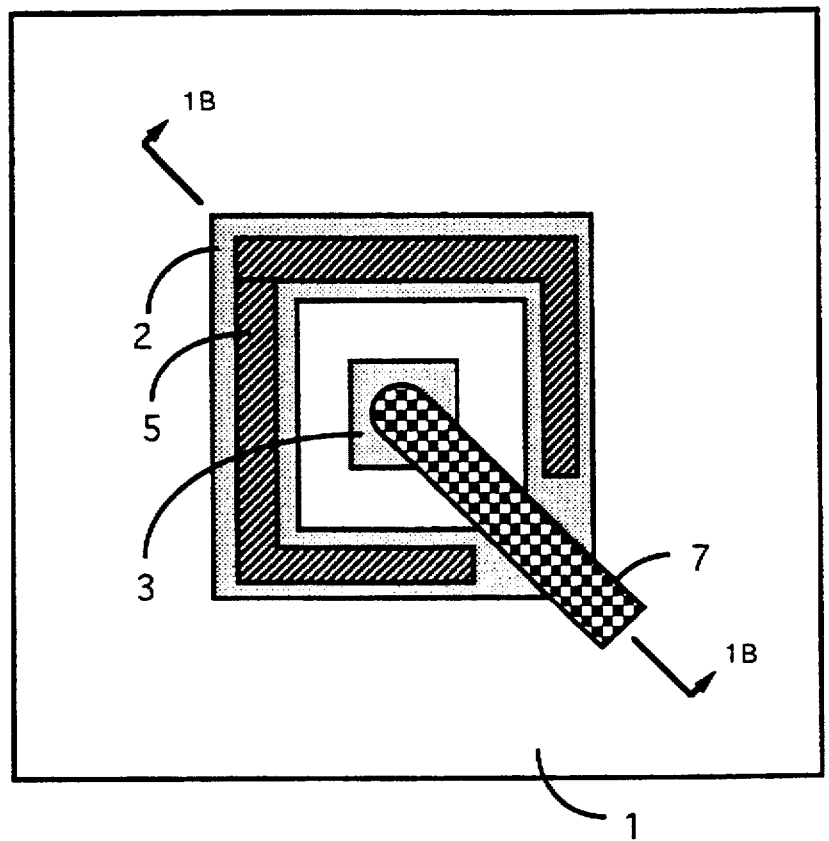
FIGS. 1A, B show a configuration of lateral type transistor having a single transistor cell according to a first embodiment of the present invention.
Figure 1B:
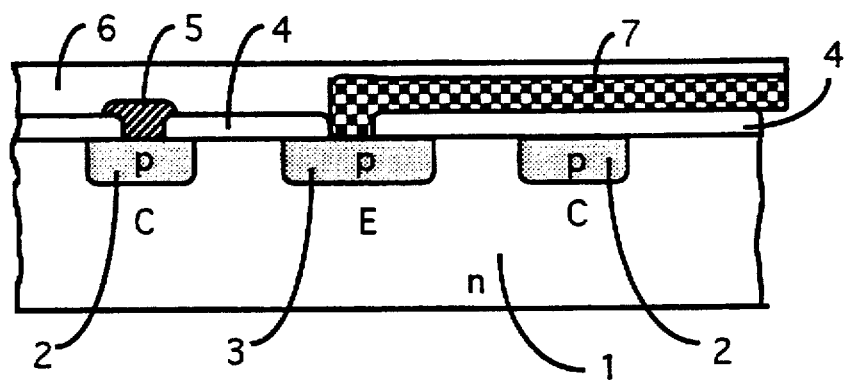

FIGS. 1A, B show a configuration of a single-element lateral type transistor according to a first embodiment of the present invention. The configuration in FIGS. 1A, B comprises n-type semiconductor layer 1, collector layer 2, namely a p-type semiconductor layer provided in the n-type semiconductor layer 1, emitter layer 3, namely a p-type semiconductor layer provided in the n-type semiconductor layer 1, insulating layer 4 which covers the surface of n-type semiconductor layer 1, collector electrode 5 provided on the outer surface of insulating layer 4 through a penetration hole opened in insulating layer 4, insulating layer 6 which covers the surface of insulating layer 4 and collector electrode 5, and an emitter electrode 7 drawn out from emitter layer 3.

In FIGS. 1A, B, one of the corner portions is removed from the collector electrode 5. Emitter electrode 7 is provided on insulating layer 4 through the penetration hole opened in insulating layer 4, and is drawn out diagonally toward the above-mentioned one corner portion, as A—A line cross-sectional view of FIGS. 1A, B shows.

The corner portions of collector layer 2 have more distance from emitter layer 3 than from the side portions of collector layer 2. Therefore, an operation characteristics of the transistor is less efficient in the corner portions than the side portions. In this embodiment, the whole transistor efficiency can be remained if metal is removed from one corner portion of the collector where operation characteristics are less efficient. Further, compared with a prior art, shape of the emitter layer 3 becomes smaller since emitter electrode 7 can be formed directly on insulating layer 4, which makes it possible to manufacture small sized lateral type transistor.

Embodiment 2

Figure 2A:
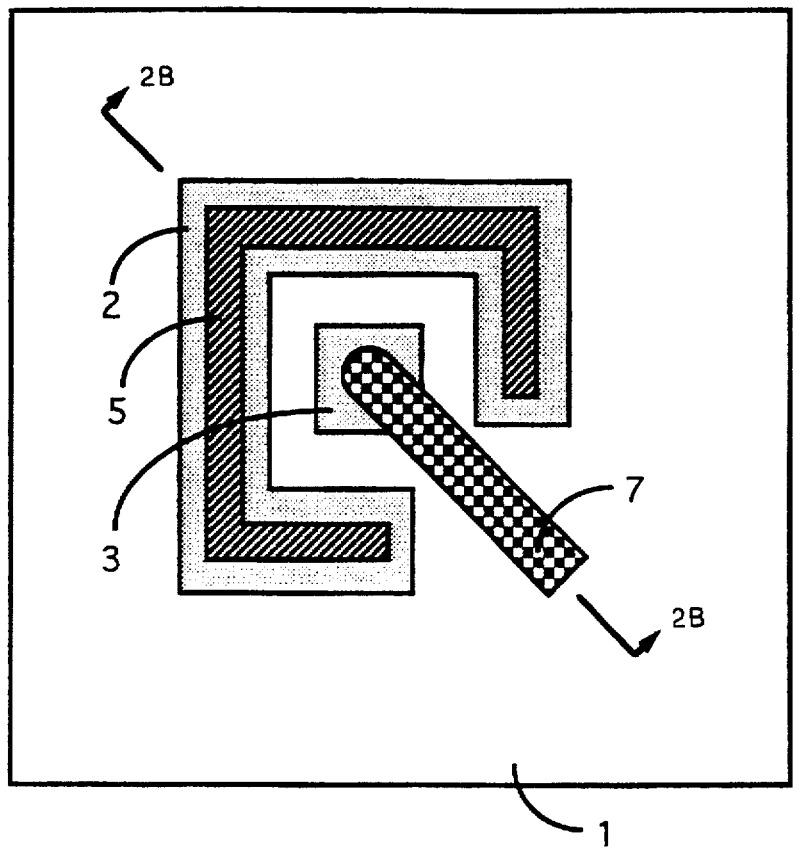
FIGS. 2A, B show a configuration of lateral type transistor having a single transistor cell according to a second embodiment of the present invention.
Figure 2B:
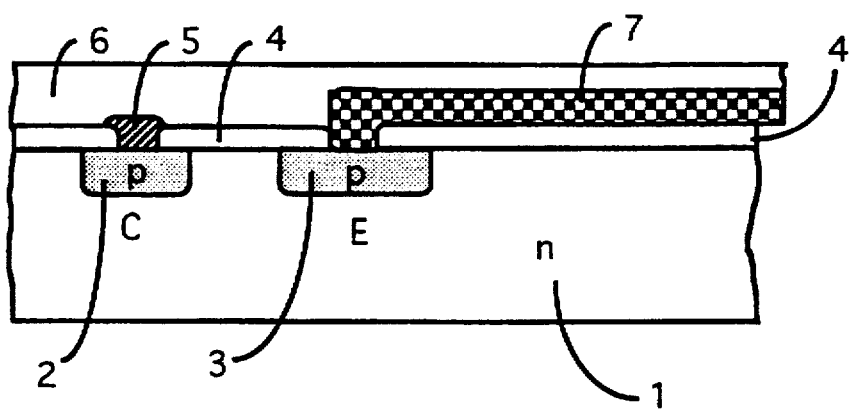

FIGS. 2A, B show configuration of a single-element lateral type transistor according to a second embodiment of the present invention. In FIGS. 2A, B, the same numerals as in FIGS. 1A, B denote the same elements or components, so the explanation is omitted. Collector layer 2 in one of the corner portions are removed as well as collector electrode 5 of the same corner portion, as B—B line cross-sectional view of FIGS. 2A, B shows. By this process, no collector layer 2 is formed at all in one of the corner portions in this embodiment as FIGS. 2A, B show, compared to the first embodiment. Emitter electrode 7 is provided on insulating layer 4 through the penetration hole opened in insulating layer 4 and is drawn out diagonally from semiconductor layer 3 toward the one corner portion.

The corner portions of collector layer 2 are more apart from emitter layer 3 than from the side portions of collector layer 2. Therefore, an operation characteristics of the transistor is less efficient in the corner portions than the side portions. In this embodiment, the whole transistor efficiency can be remained if collector layer 2 and metal layer 5 are removed from one corner portion of the collector where operation characteristics are less efficient. Further, compared with a prior art, shape of the emitter layer 3 becomes smaller since emitter electrode 7 can be formed directly on insulating layer 4, which makes it possible to manufacture small sized lateral type transistor. Moreover, a parasitic metal oxide semi-conductor transistor is not formed because collector layer 2 is not formed at the corner portion as FIGS. 2A, B show.

Embodiment 3

Figure 3A:
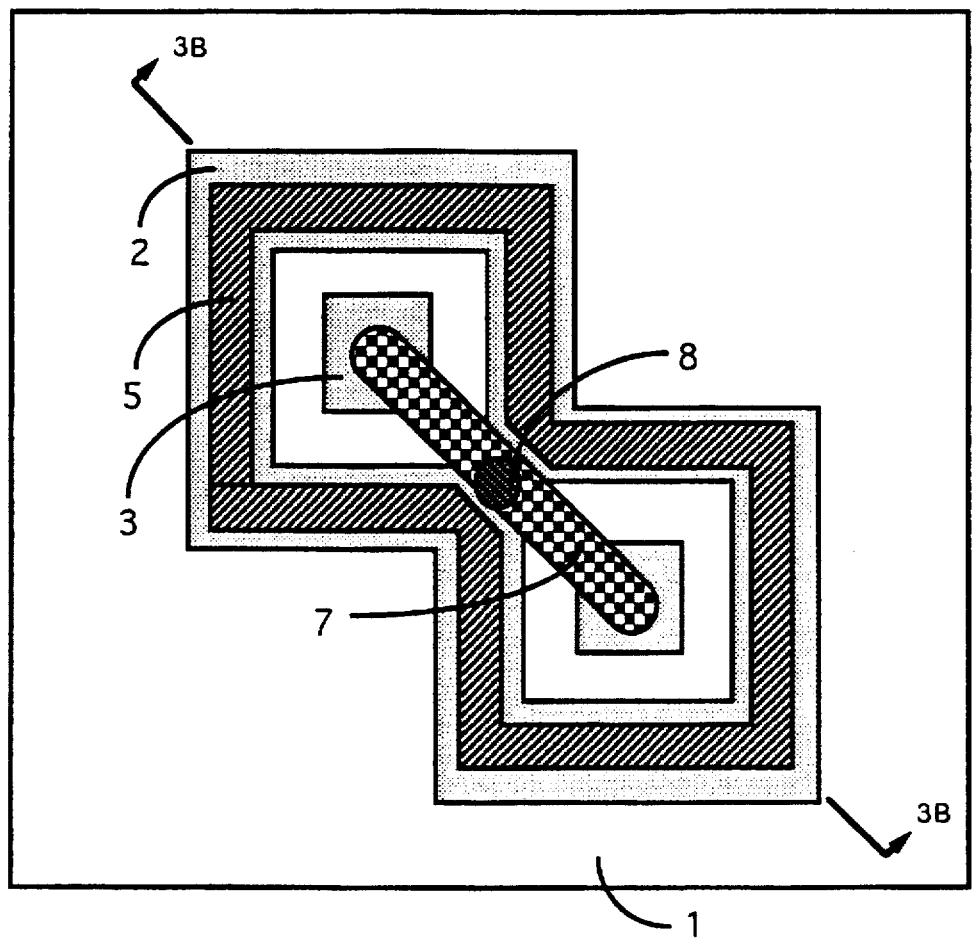
FIGS. 3A, B show a configuration of lateral type transistor having two transistor cells according to a third embodiment of the present invention.
Figure 3B:
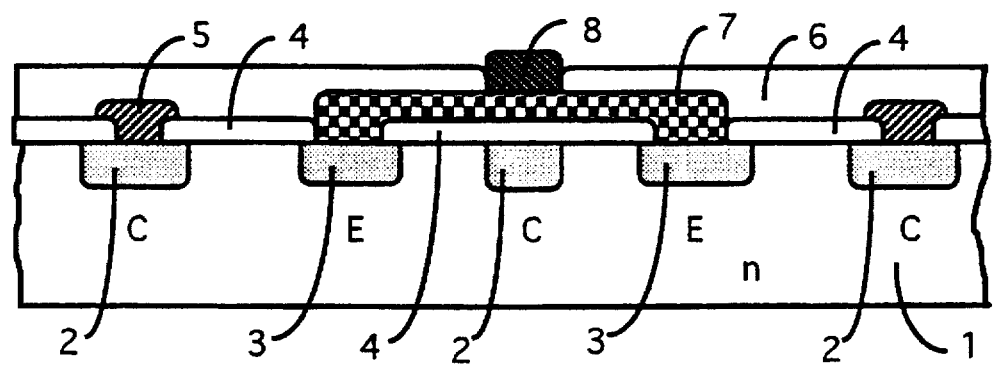

FIGS. 3A, B show a configuration of a pair of two-element lateral type transistors according to a third embodiment of the present invention. In FIGS. 3A, B, the numerals having the same as those in FIGS. 1A, B denote the same elements or components, so the explanation is omitted. In FIGS. 3A, B, two transistor cells which consist a unit transistor are connected mutually via emitter electrode 7. A plurality of such unit transistors connected in parallel further constitute a lateral type transistor having a large capacity.

In FIGS. 3A, B, collector electrode 5 at a corner portion where two transistor cells intersect is removed. By this process, collector electrode 5 is not formed at the corner portion although collector layer 2 is formed, as C—C line cross-sectional view of FIGS. 3A, B shows. Emitter electrode 7 is drawn out diagonally from emitter layer 3 of one transistor toward that of the other transistor along one corner portion provided on insulating layer 4, through penetration holes opened in insulating layer 4. Each penetration hole at respective transistors is opened at insulating layer 6 to connect emitter electrode 7. The emitter electrode connects each transistor in a pair of unit transistors as well as metal layer 8. Then one unit transistor is connected to other unit transistor in parallel through metal layer 8.

The corner portions of collector layer 2 have more distance from emitter layer 3 than from the side portions of collector layer 2. Therefore, an operation characteristics of the transistor is less efficient in the corner portions than the side portions. In this embodiment, the whole transistor efficiency can be remained if metal is removed from one corner portion of the collector where operation characteristics are less efficient. Further, compared with a prior art, shape of the emitter layer 3 becomes smaller since emitter electrode 7 can be formed directly on insulating layer 4, which makes it possible to manufacture small sized lateral type transistor. Moreover, a unit transistor may be manufactured smaller by connecting two-element lateral type transistors mutually via the portions where collector electrode 5 has been removed.

Embodiment 4

Figure 4A:
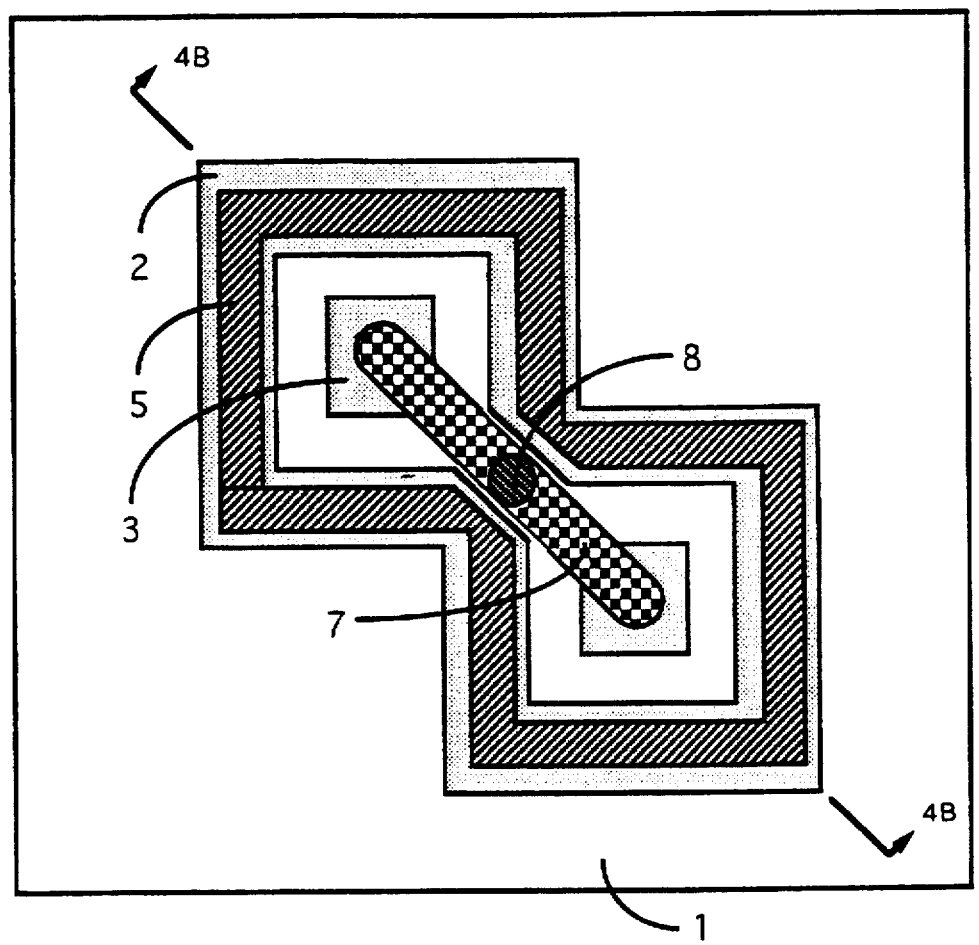
FIGS. 4A, B show a configuration of lateral type transistor having two transistor cells according to a fourth embodiment of the present invention.
Figure 4B:
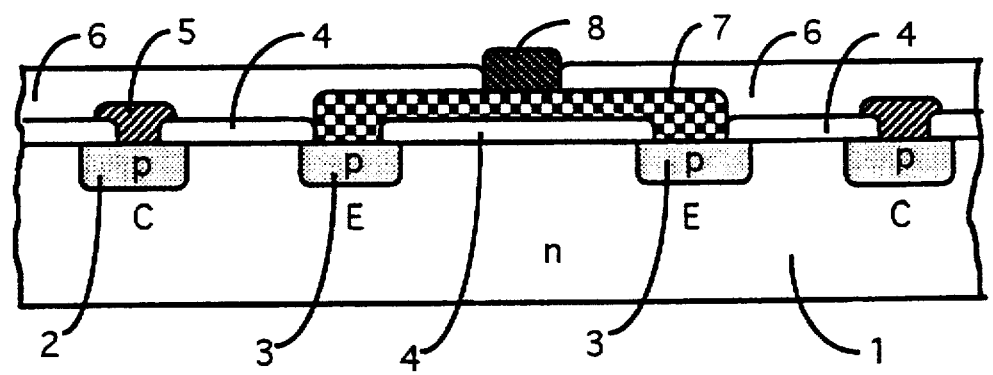

FIGS. 4A, B show a configuration of a pair of two-element lateral type transistors according to a fourth embodiment of the present invention. The configuration of FIGS. 4A, B further comprises connection metal layer 8 which is connected with emitter electrode 7 through a penetration hole opened in insulating layer 6. In FIGS. 4A, B, the numerals having the same as those in FIGS. 1A, B denote the same elements or components, so the explanation is omitted. In FIGS. 4A, B, two transistor cells which consist a unit transistor are connected mutually via emitter electrode 7. A plurality of such unit transistors connected in parallel further constitute a lateral type transistor having a large capacity.

In FIGS. 4A, B, collector layer 2 and collector electrode 5 at a corner portion where two transistor cells intersect are removed. By this process, neither collector electrode 5 nor collector layer 2 is formed at the corner portion, as D—D line cross-sectional view of FIGS. 4A, B shows. Emitter electrode 7 is drawn out diagonally from emitter layer 3 of one transistor toward that of the other transistor along one corner portion provided on insulating layer 4, through penetration holes opened in insulating layer 4. Each penetration hole at respective transistors is opened at insulating layer 6 to connect emitter electrode 7. The emitter electrode connects each transistor in a pair of unit transistors as well as metal layer 8. Then one unit transistor is connected to other unit transistor in parallel through metal layer 8.

The corner portions of collector layer 2 have more distance from emitter layer 3 than from the side portions of collector layer 2. Therefore, an operation characteristics of the transistor is less efficient in the corner portions than the side portions. In this embodiment, the whole transistor efficiency can be remained if collector layer 2 and metal layer 5 are removed from one corner portion of the collector where operation characteristics are less efficient. Further, compared with a prior art shape of the emitter layer 3 becomes smaller since emitter electrode 7 can be formed directly on insulating layer 4, which makes it possible to manufacture small sized lateral type transistor. Moreover, a unit transistor may be manufactured smaller by connecting two-element lateral type transistors mutually via the portions where collector electrode 5 has been removed. Moreover, a parasitic metal oxide semiconductor transistor is not formed because collector layer 2 is not formed at the corner portion as FIGS. 4A, B show. Moreover, a unit transistor may be manufactured smaller by connecting two-element lateral type transistors mutually via the portions where collector electrode 5 has been removed.

Embodiment 5

Figure 5A:
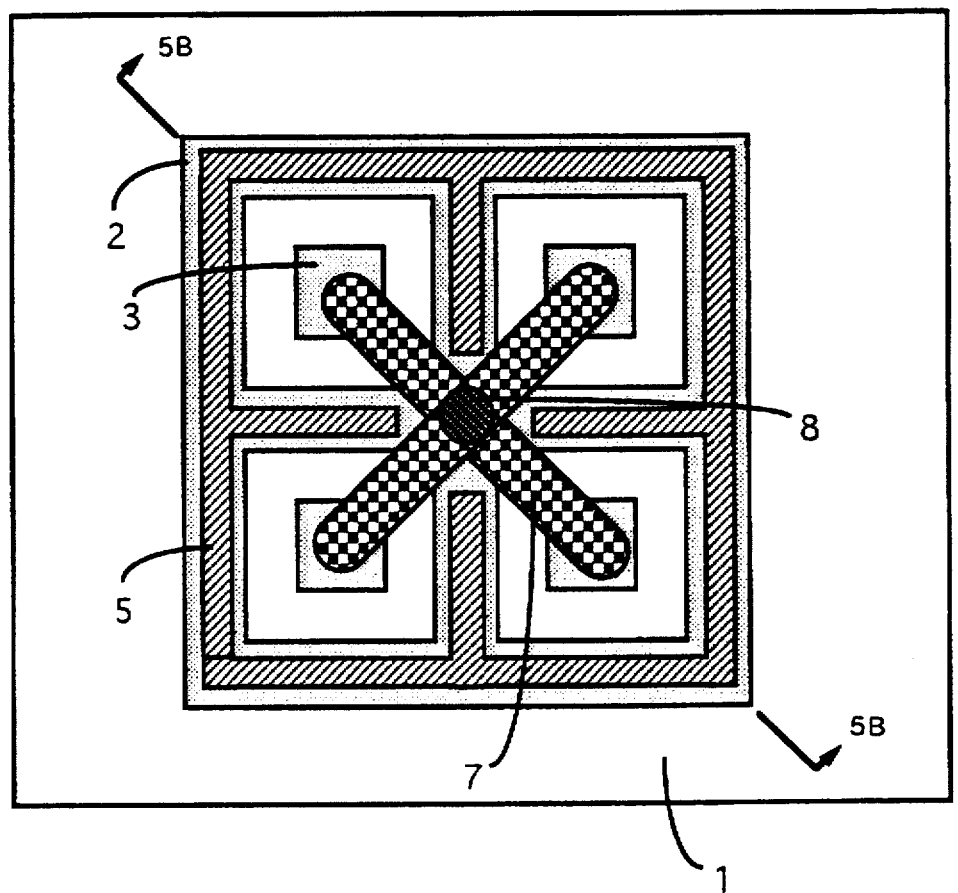
FIGS. 5A, B show a configuration of lateral type transistor having a plurality of transistor cells according to a fifth embodiment of the present invention.
Figure 5B:
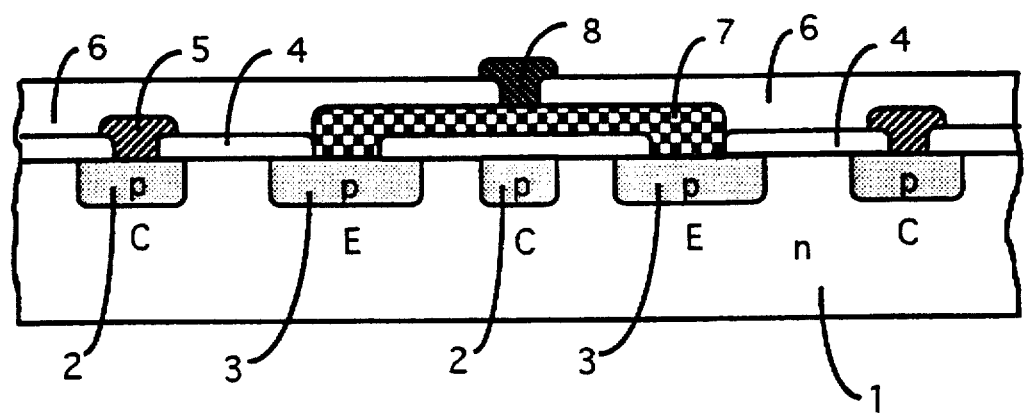

FIGS. 5A, B show a configuration of a multiple-element lateral type transistor according to a fifth embodiment of the present invention. In FIGS. 5A, B, the numerals having the same as those in FIGS. 1A, B denote the same elements or components, so the explanation is omitted. In FIGS. 5A, B, each emitter layer 3 in four transistor cells connected via emitter electrode 7 constitute a unit transistor. A plurality of unit transistors connected in parallel constitute a lateral type transistor having a large capacity.

In FIGS. 5A, B, collector electrode 5 at a corner portion where four transistor cells intersect is removed. By this process, collector electrode 5 is not formed at the corner portion although collector layer 2 is formed, as E—E line cross-sectional view of FIGS. 5A, B shows. Emitter electrode 7 is drawn diagonally along center corner portions on insulating layer 4 through a penetration whole opened in insulating layer 4. Respective emitter layer 3 in respective transistor cell which are diagonally facing each other are connected by the emitter electrode 7. In the same manner, emitter layers in the rest of transistor cells which are diagonally facing each other are connected with each other via emitter electrode 7. Accordingly, four emitter layers 3 are connected via emitter electrode 7. A penetration hole is opened in insulating layer 6 to connect each emitter layer in a pair of unit transistors in parallel using emitter electrode 7 via metal layer 8.

The corner portions of collector layer 2 have more distance from emitter layer 3 than from the side portions of collector layer 2. Therefore, an operation characteristics of the transistor is less efficient in the corner portions than the side portions. In this embodiment, the whole transistor efficiency can be remained if metal is removed from one corner portion of the collector where operation characteristics are less efficient. Further, compared with a prior art, shape of the emitter layer 3 becomes smaller since emitter electrode 7 can be formed directly on insulating layer 4, which makes it possible to manufacture small sized lateral type transistor. Moreover, a unit transistor may be manufactured smaller by connecting two-element lateral type transistors mutually via the portions where collector electrode 5 has been removed.

Embodiment 6

Figure 6A:
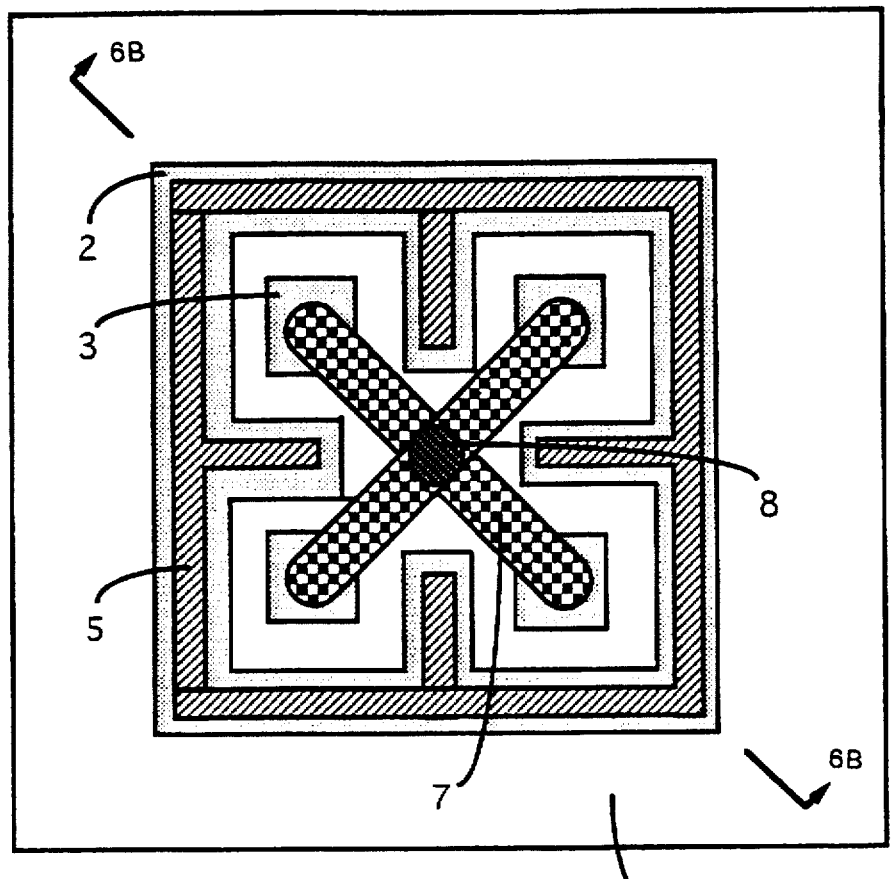
FIGS. 6A, B show a configuration of lateral type transistor having a plurality of transistor cells according to a sixth embodiment of the present invention.
Figure 6B:
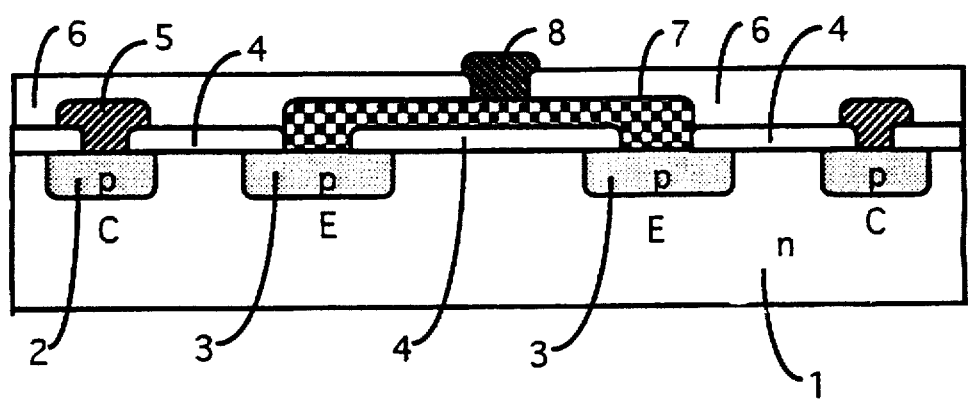
Figure 7A:
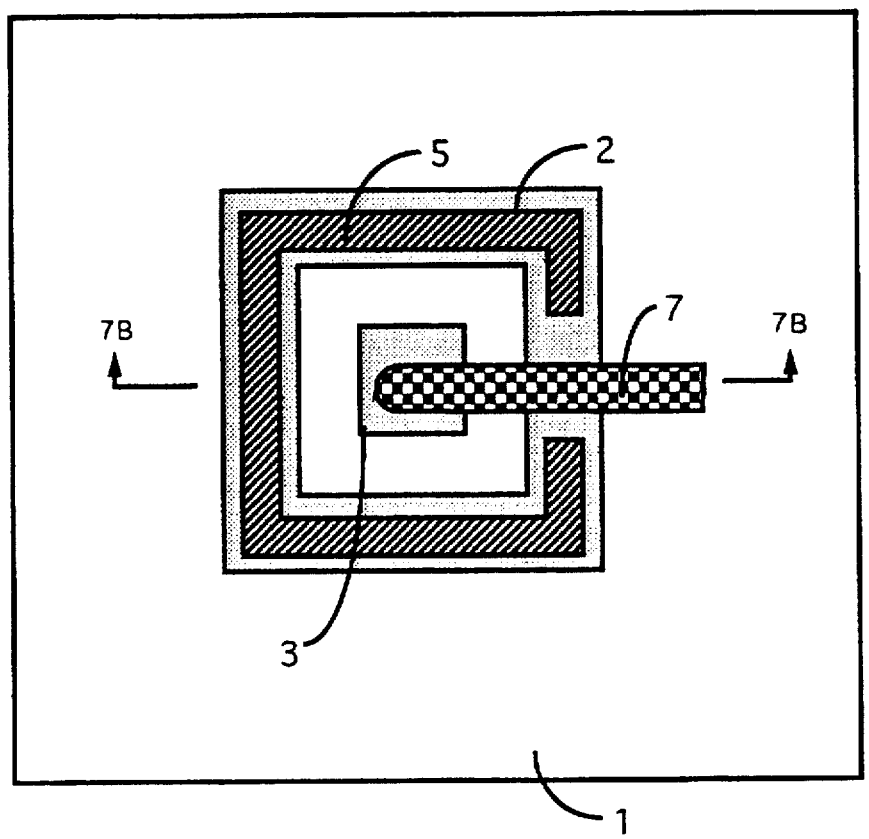
FIGS. 7A, B show a configuration of lateral type transistor having a single transistor cell in the prior art.
Figure 7B:
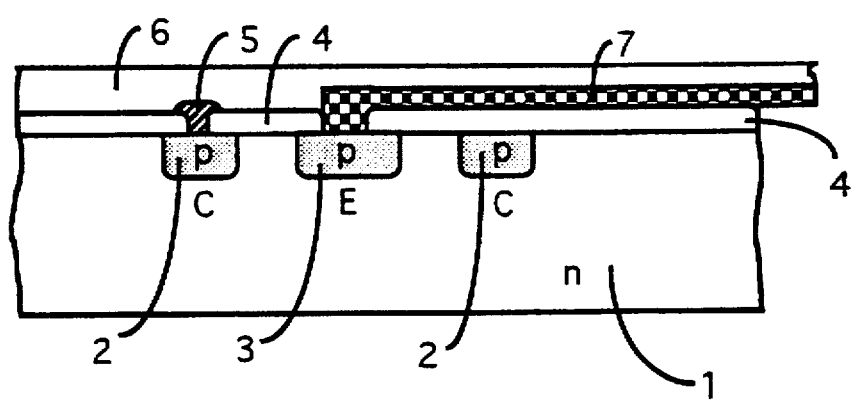
Figure 8A:
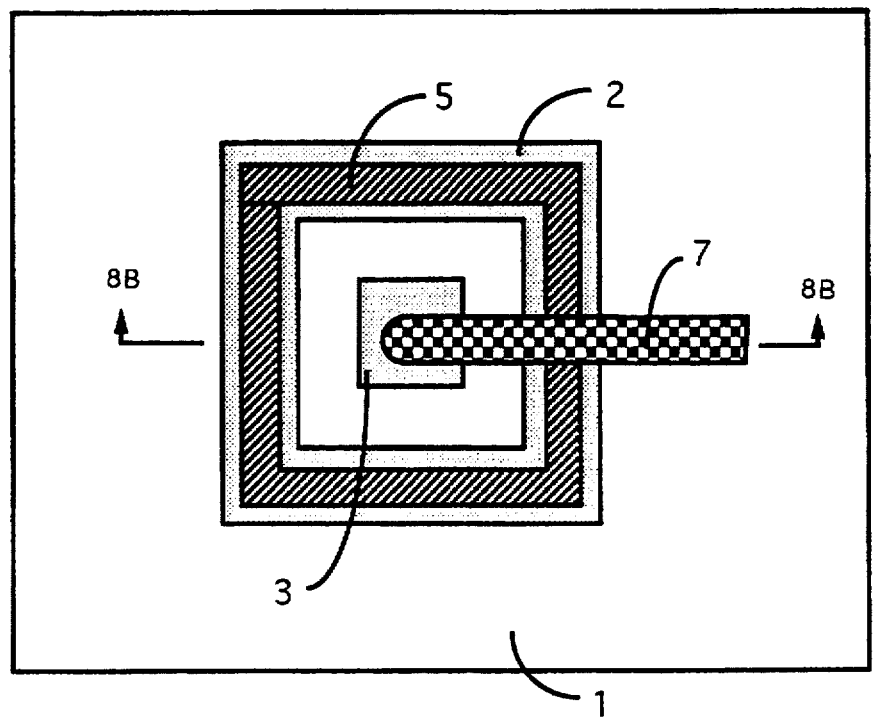
FIGS. 8A, B show another configuration of lateral type transistor having a single transistor cell in the prior art.
Figure 8B:
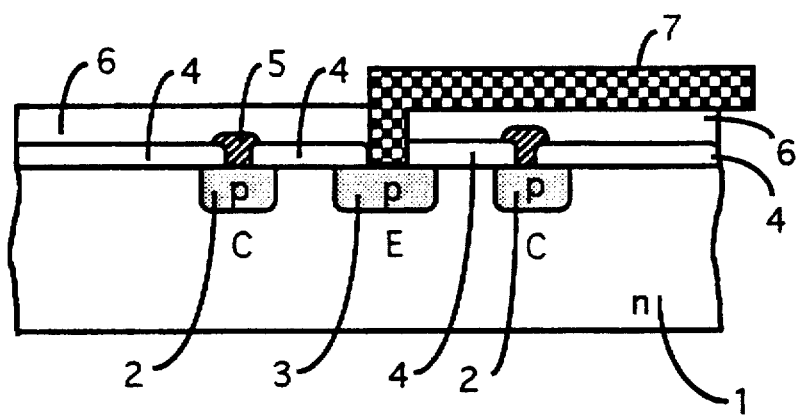
Figure 9A:
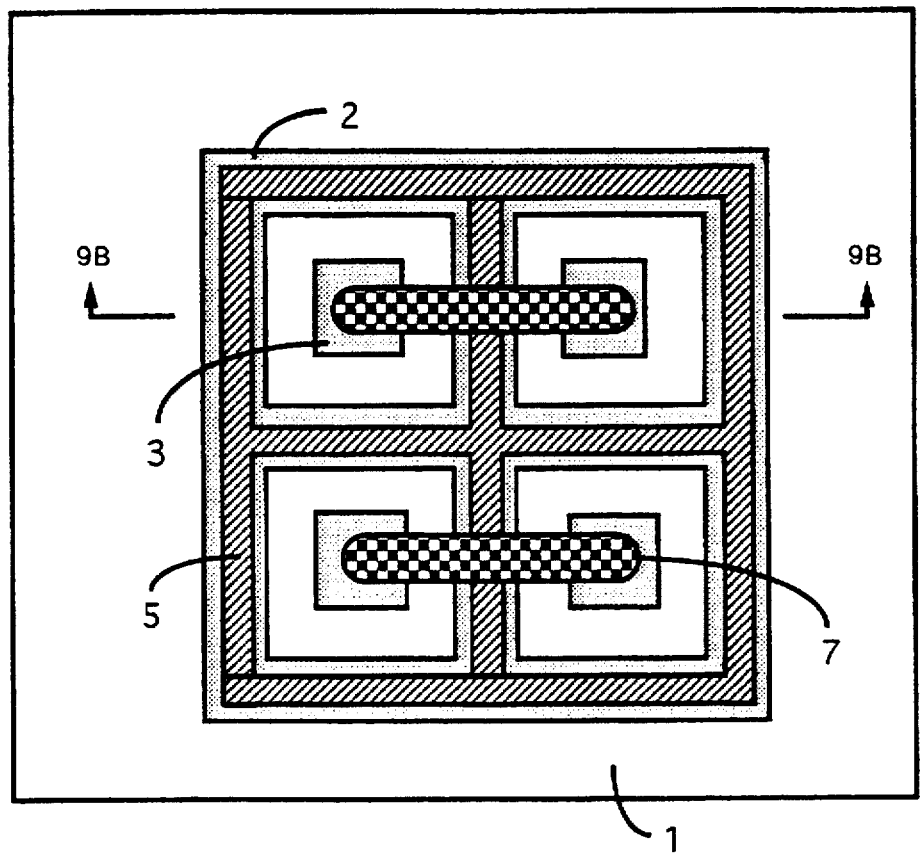
FIGS. 9A, B show a configuration of lateral type transistor having a plurality of transistor cells in the prior art.
Figure 9B:
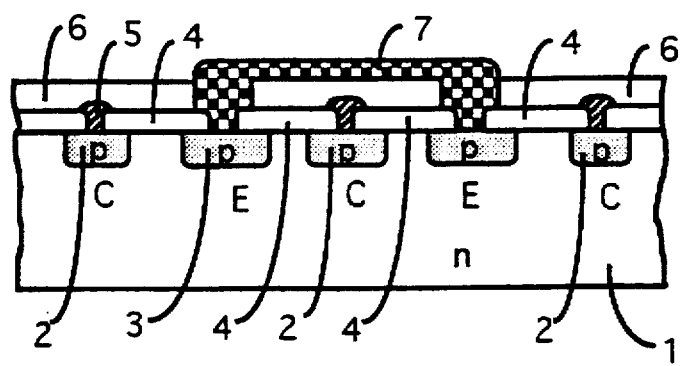
Figure 10A:
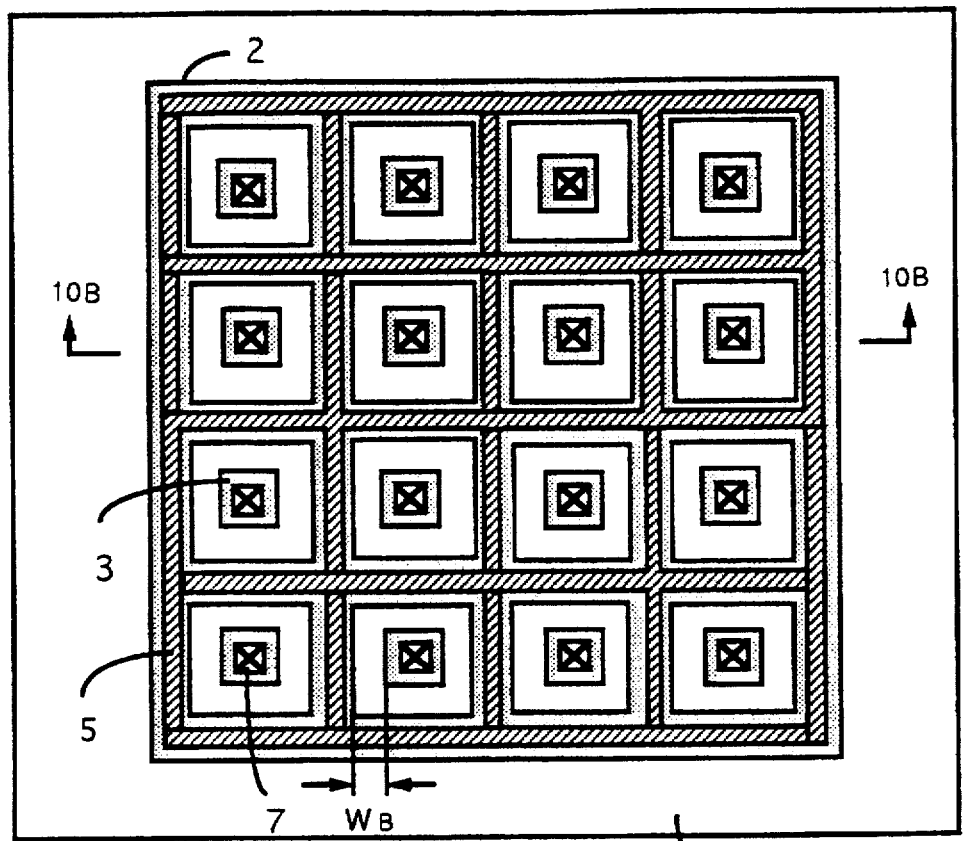
FIGS. 10A, B show a configuration of lateral type transistor having a plurality of transistor cells in the prior art.
Figure 10B:
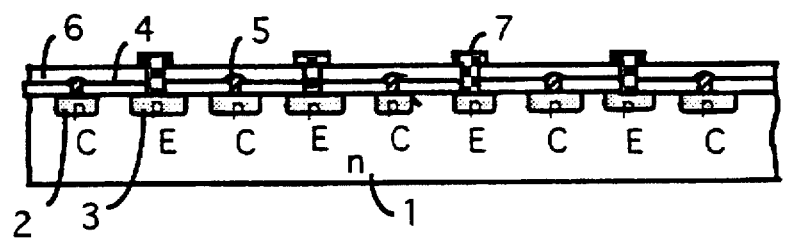

FIGS. 6A, B show a configuration of a multiple-element lateral type transistor according to a sixth embodiment of the present invention. In FIGS. 6A, B, the numerals having the same as those in FIGS. 4A, B denote the same elements or components, so the explanation is omitted. In FIGS. 6A, B, each emitter layer 3 in four transistor cells connected via emitter electrode 7 constitute a unit transistor. A plurality of unit transistors connected in parallel constitute a lateral type transistor having a large capacity.

In FIGS. 6A, B, collector layer 2 and collector electrode 5 at a corner portion where two transistor cells intersect are removed. By this process, neither collector electrode 5 nor collector layer 2 is formed at the corner portion, as F—F line cross-sectional view of FIGS. 6A, B show. Emitter electrode 7 is drawn out diagonally from emitter layer 3 of one transistor toward that of the other transistor along one corner portion provided on insulating layer 4, through penetration holes opened in insulating layer 4. In the same manner, emitter layers in the rest of transistor cells which are diagonally facing each other are connected with each other via emitter electrode 7. Accordingly, four emitter layers 3 are connected via emitter electrode 7. A penetration hole is opened in insulating layer 6 to connect each emitter layer in a pair of unit transistors in parallel using emitter electrode 7 via metal layer 8.

The corner portions of collector layer 2 have more distance from emitter layer 3 than from the side portions of collector layer 2. Therefore, an operation characteristics of the transistor is less efficient in the corner portions than the side portions. In this embodiment, the whole transistor efficiency can be remained if collector layer 2 and metal layer 5 is removed from one corner portion of the collector where operation characteristics are less efficient. Further, compared with a prior art shape of the emitter layer 3 becomes smaller since emitter electrode 7 can be formed directly on insulating layer 4, which makes it possible to manufacture small sized lateral type transistor. Moreover, a parasitic metal oxide semi-conductor transistor is not formed because collector layer 2 and collector electrode 5 are not formed at the corner portion as FIGS. 6A, B show.

What is claimed is:

1. A lateral transistor comprising:

a semiconductor substrate of a first conductivity type and having a major surface;

an emitter region of a second conductivity type in said semiconductor substrate at the major surface;

a collector region of a second conductivity type in said semiconductor substrate at said major surface, spaced from and surrounding said emitter region; and including a plurality of sides and corners;

an electrically insulating film covering the major surface of said semiconductor substrate and including a first penetrating hole extending to said collector region except at a first corner of said plurality of corners and a second penetrating hole extending to said emitter region;

a collector electrode contacting said collector region through the first penetrating hole and surrounding said emitter region except at the first corner;

an emitter electrode contacting said emitter region through the second penetrating hole; and an emitter wiring layer contacting said emitter electrode, disposed on said insulating film, and extending from said emitter electrode across the first corner.

2. A lateral transistor comprising:

a semiconductor substrate of a first conductivity type and having a major surface;

an emitter region of a second conductivity type in said semiconductor substrate at the major surface;

a collector region of a second conductivity type in said semiconductor substrate at said major surface, including a plurality of sides and corners, and spaced from and surrounding said emitter region except at a first corner;

an electrically insulating film covering said major surface of said semiconductor substrate and including a first penetrating hole extending to said collector region and a second penetrating hole extending to said emitter region;

a collector electrode contacting said collector region through the first penetrating hole and surrounding said emitter region except at said first corner;

an emitter electrode contacting said emitter region through the second penetrating hole; and an emitter wiring layer contacting said emitter electrode, disposed on said insulating film and extending from said emitter electrode across the first corner.

3. A lateral transistor comprising:

a semiconductor substrate of a first conductivity type having a major surface, an insulating film covering said major surface of said semiconductor substrate, and a pair of transistor cells in said semiconductor substrate at said major surface, electrically connected to each other in parallel, each transistor cell comprising:

an emitter region of a second conductivity type in said semiconductor substrate at said major surface;

a collector region of a second conductivity type in said semiconductor substrate at said major surface spaced from and surrounding said emitter region and including a plurality of sides and corners;

a collector electrode contacting said collector region through a first penetrating hole in said insulating film, said collector electrode and the first penetrating hole surrounding said emitter region except at a first corner;

an emitter electrode contacting said emitter region through a second penetrating hole in said insulating film; and an emitter wiring layer contacting said emitter electrode, disposed on said insulating film, and extending from said emitter electrode across said first corner, wherein said first corners of said pair of transistor cells overlap, said collector regions of said pair of transistor cells are continuous across said first corners, said collector electrodes of said pair of transistor cells are continuous at but do not extend across said first corners, and said emitter wiring layers of said pair of transistor cells are continuous and extend across said first corners.

4. A lateral transistor comprising:

a semiconductor substrate of a first conductivity type having a major surface, an insulating film covering said manor surface of said semiconductor substrate, and a pair of transistor cells in said semiconductor substrate at said major surface, electrically connected to each other in parallel, each transistor cell comprising:

an emitter region of a second conductivity type in said semiconductor substrate at said manor surface;

a collector region of a second conductivity type in said semiconductor substrate at said manor surface, including a plurality of sides and corners, spaced from and surrounding said emitter region except at a first corner;

a collector electrode contacting said collector region through a first penetrating hole in said insulating films said collector electrode and the first penetrating hole surrounding said emitter region except at a first corner;

an emitter electrode contacting said emitter region through a second penetrating hole in said insulating film; and an emitter wiring layer contacting said emitter electrode, disposed on said insulating film, and extending from said emitter electrode across said first corner, wherein said first corners of said pair of transistor cells overlap, said collector regions of said pair of transistor cells are continuous at but do not extend across said first corners, said collector electrodes of said pair of transistors cells are continuous at but do not extend across said first corners, and said emitter wiring layers of said pair of said transistor cells are continuous at and extend across said first corners.

5. A lateral transistor comprising:

a semiconductor substrate of a first conductivity type having a major surface, an insulating film covering said major surface of said semiconductor substrate, and four transistor cells in said semiconductor substrate at said major surface and electrically connected in parallel to each other, each transistor cell comprising:

an emitter region of a second conductivity type in said semiconductor substrate at said major surface;

a collector region of a second conductivity type in said semiconductor substrate at said major surface spaced from and surrounding said emitter region and including a plurality of sides and corners;

a collector electrode contacting said collector region through a first penetrating hole in said insulating film said collector electrode and said first penetrating hole surrounding said emitter region except at a first corner;

an emitter electrode contacting said emitter region through a second penetrating hole in said insulating film; and an emitter wiring layer contacting said emitter electrode, disposed on said insulating film, and extending from said emitter electrode across said first corner, wherein said first corners of said collector regions of said four transistor cells are contiguous, said collector regions of said four transistor cells are continuous at and extend across said first corners, said collector electrodes of said four transistor cells are continuous but do not extend across said first corners, and said emitter wiring layers of said four transistor cells are continuous at and extend across said first corners.

6. A lateral transistor comprising:

a semiconductor substrate of a first conductivity type having a major surface, an insulating film covering said major surface of said semiconductor substrate, and four transistor cells in said semiconductor substrate at said major surface and electrically connected in parallel to each other, each transistor cell comprising:

an emitter region of a second conductivity type in said semiconductor substrate at said major surface;

a collector region of a second conductivity type in said semiconductor substrate at said major surface, including a plurality of sides and corners, spaced from and surrounding said emitter region except at a first corner;

a collector electrode contacting said collector region through a first penetrating hole in said insulating film, saidcollector electrode and said first penetrating hole surrounding said emitter region except at a first corner;

an emitter electrode contacting said emitter region through a second penetrating hole in said insulating film; and an emitter wiring layer contacting said emitter electrode, disposed on said insulating film, and extending from said emitter electrode across said first corner, wherein said first corners of said collector regions of said four transistor cells are contiguous, said collector regions of said four transistor cells are continuous but do not extend across said first corners, said collector electrodes of said four transistor cells are continuous but do not extend across said first corners, and said emitter wiring layers of said four transistor cells are continuous at and extend across said first corners.

7. The lateral transistor of claim 1 wherein the first conductivity type is n-type and the second conductivity type is p-type.

8. The lateral transistor of claim 2 wherein the first conductivity type is n-type and the second conductivity type is p-type.

9. The lateral transistor of claim 3 wherein the first conductivity type is n-type and the second conductivity type is p-type.

10. The lateral transistor of claim 4 wherein the first conductivity type is n-type and the second conductivity type is p-type.

11. The lateral transistor of claim 5 wherein the first conductivity type is n-type and the second conductivity type is p-type.

12. The lateral transistor of claim 6 wherein the first conductivity type is n-type and the second conductivity type is p-type.

13. The lateral transistor of claim 1 wherein the first conductivity type is p-type and the second conductivity type is n-type.

14. The lateral transistor of claim 2 wherein the first conductivity type is p-type and the second conductivity type is n-type.

15. The lateral transistor of claim 3 wherein the first conductivity type is p-type and the second conductivity type is n-type.

16. The lateral transistor of claim 4 wherein the first conductivity type is p-type and the second conductivity type is n-type.

17. The lateral transistor of claim 5 wherein the first conductivity type is p-type and the second conductivity type is n-type.

18. The lateral transistor of claim 6 wherein the first conductivity type is p-type and the second conductivity type is n-type.

19. A lateral transistor comprising:

a semiconductor substrate of a first conductivity type and having a major surface;

an insulating film covering said first major surface;

a plurality of transistor cells electrically connected in parallel to each other, each transistor cell comprising:

an emitter region of a second conductivity type in said semiconductor substrate at said major surface;

a collector region of a second conductivity type in said semiconductor substrate at said major surface, spaced from and surrounding said emitter region, and including a plurality of sides and corners;

a collector electrode contacting said collector region through a first penetrating hole in said insulating film, extending on said collector region except at a first corner of said plurality of corners, and surrounding said emitter region except at said first corner;

an emitter electrode contacting said emitter region through a second penetrating hole in said insulating layer; and an emitter wiring layer on said insulating layer contacting said emitter electrode, and extending from said emitter electrode across said first corner.

20. The lateral transistor of claim 19 wherein said first corners of neighboring transistor cells are contiguous, said collector regions of neighboring transistor cells in said plurality of transistor cells are continuous at said first corners, said collector electrodes of neighboring transistor cells are continuous at but do not extend across said first corners, and said emitter wiring layers of neighboring transistor cells are continuous at and extend across said first corners.

21. A lateral transistor comprising:

a semiconductor substrate of a first conductivity type and having a major surface;

an insulating film covering said first major surface;

a plurality of transistor cells electrically connected in parallel to each other, each transistor cell comprising:

an emitter region of a second conductivity type in said semiconductor substrate at said major surface;

a collector region of a second conductivity type, including a plurality of sides and corners, in said semiconductor substrate at said major surface, spaced from said emitter region and surrounding said emitter region except at a first of said plurality of corners;

a collector electrode contacting said collector region through a first penetrating hole in said insulating film, extending on said collector region, and surrounding said emitter region except at said first corner;

an emitter electrode contacting said emitter region through a second penetrating hole in said insulating layer; and an emitter wiring layer on said insulating layer contacting said emitter electrode and extending from said emitter electrode across said first corner.

22. The lateral transistor of claim 21 wherein said first corners of said neighboring transistor cells are contiguous, said collector regions of neighboring transistor cells in said plurality of transistor cells are continuous but do not extend across said first corners, said collector electrodes of neighboring transistor cells in said plurality of transistor cells are continuous but do not extend across said first corners, and said emitter wiring layers of neighboring transistor cells in said plurality of transistor cells are continuous and extend across said first corners.

* * * * *

UNITED STATES PATENT AND TRADEMARK OFFICE
CERTIFICATE OF CORRECTION

PATENT NO. : 5,783,855
DATED : July 21, 1998
INVENTOR(S) : Kawakita et al.

It is certified that error appears in the above-identified patent and that said Letters Patent is hereby corrected as shown below:

Column 8, Line 59, change ";" to --,--;

Column 10, Line 1, change "manor" to --major--;

Line 6, change "manor" to --major--;

Line 8, change "manor" to --major--;

Line 12, change "films" to --film,--.

Signed and Sealed this

Tenth Day of November 1998

Attest:

BRUCE LEHMAN

Attesting Officer

Commissioner of Patents and Trademarks